United States Patent [19]

Crooks

[11] 4,260,954
[45] Apr. 7, 1981

[54] AMPLIFIER LOAD CORRECTION SYSTEM

[75] Inventor: Robert C. Crooks, Huntington Beach, Calif.

[73] Assignee: Barcus-Berry, Inc., Huntington Beach, Calif.

[21] Appl. No.: 6,735

[22] Filed: Jan. 26, 1979

[51] Int. Cl.³ .............................................. H03F 1/34
[52] U.S. Cl. .................................... 330/85; 179/1 A; 179/1 F; 330/105
[58] Field of Search ................... 330/85, 69, 105, 260, 330/293; 179/1 A, 1 F

[56] References Cited

U.S. PATENT DOCUMENTS

| | | | |
|---|---|---|---|
| 3,525,812 | 8/1970 | Verdier | 330/105 X |
| 3,902,111 | 8/1975 | Pfisterer, Jr. | 330/260 X |
| 4,092,494 | 5/1978 | Micheron | 330/105 X |
| 4,153,849 | 5/1979 | Hall et al. | 330/85 X |

FOREIGN PATENT DOCUMENTS

| | | | |
|---|---|---|---|
| 2235664 | 1/1974 | Fed. Rep. of Germany | 330/105 |
| 2800412 | 7/1978 | Fed. Rep. of Germany | 330/105 |

OTHER PUBLICATIONS

Stott et al., "Biomedical Amplifiers Using Integrated Circuits", *Medical & Biological Engineering* vol. 14, No. 6, pp. 684–687, Nov. 1976.

*Primary Examiner*—James B. Mullins
*Attorney, Agent, or Firm*—Albert L. Gabriel

[57] ABSTRACT

According to the present invention circuit means and method are provided which correct for variations in an amplifier load such as a speaker by sensing the load current, developing a feedback signal related to the load current, comparing this feedback signal with the amplifier program, and instantaneously adjusting the gain of the amplifier to compensate for load current deviations from the program applied to the amplifier. By this means the performance of the speaker or other load that is driven by the amplifier is positively controlled and forced to track accurately with the program applied to the amplifier despite such opposing factors as reactance or inertia of the load, whereby the acoustic or other load response is a substantially accurate reproduction of the program.

13 Claims, 11 Drawing Figures

AMPLIFIER LOAD CORRECTION SYSTEM

BACKGROUND OF THE INVENTION

1. Field of the Invention

The present invention is in the field of amplifiers, and relates particularly to amplifiers employed for driving loads such as speakers which are reactive and are also subjected to mechanical distortion influences such as inertia.

2. Description of the Prior Art

For about the past forty years, and still under the current state of the art, audio amplifiers have employed what is commonly referred to as "voltage feedback" to improve their frequency response and reduce distortion. Such voltage feedback system are sometimes referred to as "constant voltage" systems, since for a fixed amplifier input voltage the output voltage remains substantially constant over a broad frequency range or bandwidth. Thus, current audio amplifiers are capable of providing an output voltage for driving a speaker which quite accurately follows the amplifier input program voltage, as to both wave shape or form and phase.

However, the conventional speaker used as a load for the amplifier has both electrical characteristics and mechanical characteristics which prevent it from coming even close to following the voltage output but instead cause the speaker to depart considerably from the program applied by the amplifier in amplitude, wave form and phase, and the general result is that the acoustic response of the speaker is considerably different than the flat voltage response of the amplifier.

The conventional speaker is an inductively reactive load, and this electrical characteristic of the load creates a number of different effects which adversely affect speaker response to the program. One such effect of the inductive reactance is that it causes the load impedance to vary with frequency, the impedance becoming higher, and power to the speaker consequently lower, at higher frequencies.

The inductive reactance of the speaker load also causes the load current to lag in phase from the program, and this phase lag varies with frequency similar to the impedance, becoming much greater at higher frequencies. The current phase lag adversly affects speaker response in several different ways. Thus, it reduces the amount of power to the speaker, and this reduction is greater at higher frequencies. Much of the power that is not applied to the load because of the phase lag is, instead, dissipated as heat in the amplifier output, and this in turn requires larger, more expensive output transistors. The phase lag, in general, distorts the wave form of the program and tends to mask program detail.

Conventional amplifier voltage feedback systems are not able to provide correction for either the impedance variation with frequency or the phase lag, and the industry has simply learned to live with these adverse effects of the inductive reactance of the speaker load. Record companies have employed various types of compensations, particularly in an endeavor to improve the frequency response, but such compensations are only partially helpful and introduce their own distortions into the program.

The principal mechanical factors which adversely affect speaker performance are inertial lag and overshoot resulting from the mass of the speaker, and various resonances, particularly the open air cone resonance of the speaker, but also speaker cabinet resonance and even room resonance.

The adverse effects of inertia, and particularly of intertial overshoot, on the performance of audio systems have apparently not heretofore been fully understood, and certainly have not been treated with the seriousness that they deserve; nevertheless, applicant has determined by comparison of the acoustic response of conventional systems with that of the system of the present invention where the effects of inertia are substantially completely removed, that inertia is one of the most important factors which deteriorates speaker response in conventional systems.

Inertial lag in the conventional speaker system causes the speaker to trail behind sharply rising wave fronts in the program and thus not adequately respond to high frequency overtones and transients in the program. On the other hand, inertial overshoot causes several problems, including a similar failure to respond to sharply falling wave fronts, masking of high frequency overtones and transients, and the generation of spurious current signals in the load which result in corresponding spurious sounds that not only interfere with applied portions of the program, but overhang into open portions of the program and thereby completely cover up the important sound effects of room or hall ambience.

Inertial overshoot and the variations of phase with frequency have adverse effects on complex wave forms that are somewhat similar. Thus, in the case of inertial overshoot the speaker tends to go right on past high frequency overtones and transients, covering them up and replacing them with spurious signals; while in the case of phase lag variations with frequency, the high frequency overtones and transients have a much greater phase lag than the fundamental or basic program pulses, and are thereby in effect left behind the program to become spurious signals. Accordingly, in relatively complex wave forms such as those found in music, the combination of inertial overshoot and phase lag variations with frequency results in a portion of the speaker acoustic output being noise content that is unrelated to the music program. These interferences of phase lag and overshoot with the high frequency overtones, together with the increased speaker impedance at high frequencies, resulted in serious formant distortion in music and voice programs.

Many of the aforesaid problems in audio systems are also present in various other electrically driven loads having electrical reactance, or tending to have inertial lag or overshoot, or having other mechanical factors tending to alter movement of the load other than that prescribed by applied program. Thus, cutting heads for sound records have essentially the same inductive reactance and inertial problems as a speaker. Capacitive loads, such as capacity speakers, have reactance characteristics which cannot be matched by conventional amplifiers. Direct writing galvanometers, such as pen-writing recorders, and even optical galvanometers such as those employed for motion picture sound, have reactance and inertia problems similar to those of a speaker. In the driving of machinery, where the load is highly reactive and the machinery involves considerable inertia, some of the problems discussed above for speakers are magnified. Thus, the dissipation of large amounts of power in the amplifier output because of phase lag is expensive and difficult to cope with in this type of equipment. Problems similar to those of speakers are also found in vehicle directional control equipment such as automatic pilot controls for aircraft and ships, and remote control equipment for driving steering elements of aircraft, ships, and large land vehicles.

The very poor impedance/frequency response of a single speaker is improved in most audio systems by the use of multiple-speaker arrangements with crossover networks, and such systems can become quite expensive, employing a large number of speakers. However, such systems do not solve the more serious problems resulting from the inductive reactance of speakers of phase lag and phase lag variations with frequency; and such systems make no attempt to solve the major mechanical problems of inertial drag and overshoot. Crossover networks, although improving impedance/frequency response, nevertheless introduce further problems, including phasing problems and sharp impedance rises proximate crossover points.

Various speaker cabinet designs, some of them quite elaborate and expensive, are also employed in an endeavor to reduce speaker mechanical problems and thereby improve response. While some cabinet designs do reduce open air cone resonance at low frequencies, they introduce further problems such as speaker cabinet resonances and undesired damping, and they do not cure the major mechanical defects of inertial drag and overshoot.

The approach that the art is taking today in attempting to reduce speaker inertial overshoot is to raise the "damping factor" to as high a value as possible. The term "damping factor" as used in the art is the ratio of rated speaker impedance to amplifier output impedance. Damping factors of as high as 800 or more are claimed in the industry. However, in rating the "damping factor", the art completely ignores the fact that, insofar as actual damping is concerned, the speaker is, in effect, looking into its own resistance in series with the amplifier output in the damping circuit loop, so that the best actual damping factor obtainable would be on the order of about 1.3. Accordingly, this passive circuit approach does not do much to help counteract speaker inertial overshoot.

SUMMARY OF THE INVENTION

In view of these and other problems in the art, it is a general object of the present invention to provide an amplifier load correction system which is capable of sensing and then correcting current, and hence power, deviations in the load from the applied program in any electrically driven load having electrical reactance, or tending to have inertial lag or overshoot, or having other mechanical factors tending to alter movement of the load other than that prescribed by the applied program.

Another general object of the present invention is to provide an amplifier load correction system which has particular utility in audio systems, tightly controlling speaker movement and forcing it to track accurately with the program applied to the amplifier, whereby the acoustic response is a substantially accurate reproduction of the program.

Another object of the invention is to provide an amplifier load correction system wherein the load, such as a speaker, is caused to accurately follow a program signal applied to the amplifier despite a number of generally cumulative opposing factors heretofore accepted as inevitable in audio systems, including phase shift, phase/frequency variations, impedance/frequency variations, inertial lag and overshoot, and resonances such as open air speaker cone resonance.

A further object of the invention is to provide an amplifier load correction system which is useful for sensing and correcting both reactance and mechanical tendencies for altering the response of a transducer to an applied signal in a number of different types of amplifier-transducer systems, including but not limited to audio systems, cutting heads for sound records, capacity load systems such as capacity speaker systems, direct writing galvanometers such as pen-writing recorders, optical galvanometers of the type employed for motion picture sound, machinery such as a hammer driver, vehicle directional control equipment such as automatic pilot controls for aircraft and ships, remote control steering systems for aircraft, ships and land vehicles, and the like.

A further object of the invention is to provide an amplifier load correction system which greatly improves the power transfer efficiency between the amplifier and the load, so that close to the entire rated power of the amplifier is applicable to the load. A corollary object of the invention is to provide an amplifier load correction system which minimizes power dissipation in the amplifier, and thereby enables the use of smaller, less expensive amplifier output transistors.

Another general object of the present invention is to greatly improve high frequency overtone and transient response of an audio system so that the system is capable of accurately acoustically reconstructing the program formant structure, with all of the attacks and decays in the program acoustically reproduced in their correct proportions and phasing, and providing a wide dynamic range suitable for reproducing programs such as orchestral programs of wide dynamics in the performance.

Another object of the present invention is to provide a novel variable-gain differential operational amplifier, and variable gain active feedback circuit actuated thereby.

A still further object of the invention is to provide an amplifier load correction system which, by substantially completely eliminating spurious currents, and hence power output, produced by load itself, as from back e.m.f. generated by the inertial overshoot, or forward e.m.f. generated by speaker coil field collapse, which spurious currents and power outputs have heretofore produced a random "pink noise" as a characteristic of audio systems, and generally completely masked hall or room ambiance sounds which are actually an important part of some programs.

Yet a further object of the present invention is to provide an amplifier load correction system which overcomes speaker or other transducer inertial lag by power acceleration, and inertial overshoot by power braking, employing instantaneous shots of positive and negative voltage as required up to the full power of the amplifier. This overcoming of inertial effects heretofore present in all speaker systems is so complete that a program, no matter how complex in wave form, such as music, will be acoustically reproduced in all of its detail without the usual extraneous noise content caused by inertial overshoot, and with a clear, open sound for the first time not masked by the usual grinding noise produced by inertial overshoot. Even at extremely low "whisper levels" of the amplifier, where inertia tends to prevent a bass speaker from moving, with the invention bass speaker response is audible in its proper proportion.

A further general object of the invention is to enable audio systems to be greatly simplified, since many of the specialized speaker boxes and multiple speaker-crossover network systems were previously utilized in a sort of patchwork attempt to reduce the effects of resonances and variable frequency responses, and these effects are for the most part eliminated by the present invention.

According to the invention, an active feedback circuit continually senses load current as indicated by the voltage difference across a small resistor in series with the load, and this voltage difference is applied to a differential operational amplifier which developes a feedback signal generally directly, although not necessarily proportionally, in response to load current variations. This feedback signal is employed as a varying potential reference point for a differential amplifier in the program amplifying circuitry to continuously vary the comparative or differential signal input to such program differential amplifier according to instantaneous variations of the load current from the program. In this manner the effective gain that the program differential amplifier applies to the program is continuously instanteously adjusted to provide a corrected program voltage signal at the amplifier output which forces the load current to generally comply and be synchronous with the program voltage signal as to both form and phase. Any load current change not caused by the program, but instead caused by some load-related factor such as reactance phase shift, inertia-caused spurious currents, resonance current variations, load impedance changes due to frequency variations, or the like, will cause an instantaneous corrective change in the feedback signal which instantaneously correctively adjusts the gain of the amplifier. The input balance of the differential operational amplifier employed in the active feedback circuit of the invention may be set or adjusted between a substantially balanced condition wherein substantially constant current feedback is provided; and an unbalanced condition wherein substantially constant power feedback is provided; and in the range between these two modes of operation, the active feedback circuit of the invention will positively lock the load in with the program despite the various opposing tendancies of phase shifts, inertial lag and overshoot, and resonances.

BRIEF DESCRIPTION OF THE DRAWINGS

These and other objects of the invention will become more apparent in view of the following description in conjunction with the drawings, wherein.

DETAILED DESCRIPTION

Figure 1:
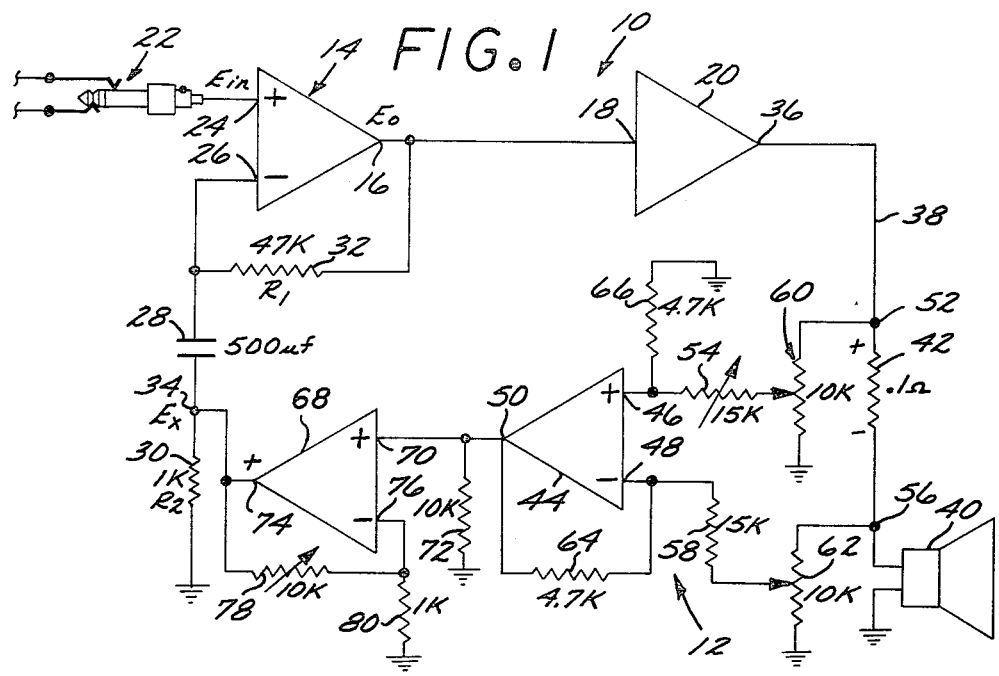
FIG. 1 is a circuit diagram illustrating the amplifier load correction system of the invention integrated into an amplifier circuit.

Referring to the drawings, FIG. 1 is a circuit diagram illustrating a form of the present invention wherein the amplifier load correction system of the invention is integrated into the amplifier circuit. The diagram of FIG. 1 may be considered as comprising two principal portions, a program signal amplifier circuit portion 10 in the upper part of the diagram, and an active feedback circuit portion 12 in the lower part of the diagram.

The program signal amplifier circuit portion 10 constitutes a power amplifier having an input differential amplifier 14, the output 16 of which is operatively connected to the input 18 of power output devices generally designated 20 which may be conventional power amplifier components. The input differential amplifier 14 may be of conventional construction, having a differential input and an in-phase output. Program signal is fed through conventional means such as an input jack 22 to the non-inverting input 24 of input differential amplifier 14, the instantaneous program input signal voltage for convenience being designated $E_{in}$. The inverting input 26 of differential amplifier 14 is connected through a capacitor 28 to one side of gainset resistor 30, the other side of which is connected to ground; and a feedback resistor 32 is operatively connected between the output 16 and inverting input 26 of differential amplifier 14.

The circuitry described above in connection with the input differential amplifier 14 is generally conventional for a preamplifier, and the gain for such differential amplifier is given by the expression $$E_o = E_{in} \cdot \left(\frac{R_1}{R_2} + 1\right)$$

where $E_o$ is the output of the differential amplifier 14; $R_1$ is the feedback resistor 32; and $R_2$ is the gainset resistor 30. With the circuit component value examples set forth in FIG. 1, $E_o = E_{in} \cdot (47/1 + 1)$, which represents a gain of 48 for amplifier 14. The program signal amplifier circuit 10 embodies conventional voltage feedback circuitry so that its output voltage will be substantially constant for a constant differential input voltage applied to the input differential amplifier 14.

However, according to the present invention the active feedback circuit portion 12 continuously senses the instantaneous current in the load that is driven by the program signal amplifier circuit portion 10 and develops a feedback voltage signal $E_x$ which is representative of the instantaneous current in the load, and applies this feedback voltage signal $E_x$ to the inverting input 26 of input differential amplifier 14 through a connection 34 between capacitor 28 and gainset resistor 30. This continuously provides an instantaneous voltage comparison at the differential input of amplifier 14 between the program signal and the load current.

Thus, whereas a conventional differential preamplifier circuit arrangement has a fixed potential reference point, e.g., ground, applied to its inverting input, against which the program signal is compared for amplification at a fixed gain, the form of the present invention exemplified in FIG. 1 provides a varying potential reference point $E_x$ which continuously varies the comparative or differential signal input to the differential amplifier 14 according to instantaneous variations of the load current from the program signal $E_{in}$, whereby the effective gain that differential amplifier 14 applies to the program signal $E_{in}$ is continuously adjusted to provide a corrected program voltage signal to the load which forces the load current to generally comply and be synchronous with the program voltage signal $E_{in}$ as to both form and phase. With the varying potential reference point $E_x$ applied to the inverting input 26 of differential amplifier 14, the gain for differential amplifier 14 may now be expressed as follows:

$$E_o = (E_{in} - E_x) \cdot \left(\frac{R_1}{R_2} + 1\right)$$

where $E_o$ is the output of differential amplifier 14; $R_1$ is feedback resistor 32; and $R_2$ is gainset resistor 30.

As described in detail hereinafter in connection with the active feedback circuit portion 12, the feedback signal $E_x$ varies generally directly (although not necessarily proportionally) in response to load current variations; i.e., a decrease in load current will result in a decrease in $E_x$, and an increase in load current will result in an increase in $E_x$; and the amount of gain of the active feedback circuit portion 12 is adjusted so that the value of $E_x$ is normally sufficiently below the value of $E_{in}$ to provide the desired gain of the power amplifier 10, as for example a gain of about 30. From the equation immediately above, it will be seen that if the load current should instantaneously become abnormally low relative to $E_{in}$, as for example where reverse load current is caused by speaker inertial overshoot, then the resulting drop in $E_x$ will increase the expression ($E_{in}-E_x$) to drive up the gain of input amplifier 14 and apply a compensating voltage to the load. Conversely, if the load current should become abnormally high relative to $E_{in}$, as for example where inductive load phase lag continues to produce too much current after a reduction in $E_{in}$, or continues to produce current where $E_{in}$ becomes zero, then the resulting reduction or even reversal of polarity of the expression ($E_{in}-E_x$) will reduce or reverse the polarity of the gain of input amplifier 14 to provide a compensating reduced or reversed voltage to the load.

The output 36 of power amplifier 10 is connected through conductor 38 to one side of the load 40, the other side of which is connected to ground. The load 40 that is illustrated is a speaker which, but for the compensation provided by the active feedback circuit 12 of the present invention, would have an acoustic output that would vary considerably from the program because of its inductive reactance and the inertia and other mechanical factors affecting speaker movement such as open air speaker cone resonance at low frequencies, speaker cabinet resonance and suppression, and room acoustics effects such as bass frequency standing waves. The inductive reactance of the speaker without the corrective circuitry of the present invention would cause load current (and hence power) phase lag from the program, and load impedance (and hence power) variations resulting from increased reactance with frequency increases and introduced by crossover networks. Speaker mass, without the present corrective circuitry, would result in inertial lag and overshoot, with resulting program masking, power losses and spurious sounds, while various other mechanical factors affecting the speaker such as resonances will severely alter the effective impedance and introduce spurious sounds. Some of the particular speaker load current and power deviations from the applied program and acoustic effects thereof will be described hereinafter in more detail in connection with FIGS. 4—13 of the drawings.

While the particular amplifier load shown and described herein is a speaker having an inductive reactance, it is to be understood that the present invention is useful to correct current, and hence power, deviations in the load from the applied program in any electrically driven load having electrical resistance, or tending to have inertial lag or overshoot, or having other mechanical factors tending to alter movement of the load other than that prescribed by the applied program. Several examples of loads other than speakers to which the present invention is applicable are given below by way of example only, and not of limitation.

One other type load for which the present invention finds application, and which involves essentially the same inductive reactance and inertia problems as a speaker, is a cutting head for sound records. Thus, with currently used technology, voice and musical instrument information cannot be cut on a record disc without very audible distortion, inertial overshoot of the head preventing the head from accurately tracking the transients. Oil damping is currently employed in an endeavor to lessen the effects of inertia, but this also adversely affects accurate tracking of the transients. However, utilization of the present invention in connection with the amplifier which drives the cutting head will apply positive motion control of the cutting head, up to the full power of the amplifier, to force the cutting head to accurately track with the applied program.

A capacitive load will also cause phase shifting and frequency response variations which are also correctable by employing the present invention in connection with the driving amplifier. An example of such a capacitive load is a capacity speaker, the reactance characteristics of which cannot be matched by conventional amplifiers. Another example of a capacitive load, the frequency response which can be improved by the present invention, is the "Audioplate" speaker produced by Barcus-Berry, Inc. of Huntington Beach, California under Barcus and Berry U.S. Pat. No. 4,048,454.

The present invention is also adaptable for synchronizing the output with the applied program in any direct writing galvanometer, as for example in a pen-writing recorder. The present invention may also be employed to synchronize the output with the program in an optical galvanometer such as those employed for motion picture sound.

In the driving of machinery, as for example in a hammer driver, where the load is highly reactive, and involves considerable inertia, and power requirements are large, with current amplifier technology the reactance and effects of inertia cause large amounts of power dissipation in the amplifier itself, requiring the use of large, expensive transistors in the amplifier to dissipate the current at peak loads, and in general requiring undesirably large and expensive equipment because of the poor efficiency of the system. Use of the present invention in connection with amplifiers driving such heavy, highly reactive loads will greatly reduce the power dissipation requirements for the driving amplifiers, provide more efficient power transfer to the load, and more efficient load operation because of its compliance with the operational parameters defined in the program.

A still further example of equipment where the present invention may be employed in connection with a driving amplifier to improve both the operation and the efficiency of the equipment is vehicle directional control equipment, as for example automatic pilot controls for aircraft and ships, and remote control equipment for driving steering elements of aircraft, ships, large land vehicles and the like.

In connection with both record cutting and speakers, much of the value of "direct feed" (as distinguished from microphone pickup) musical instrument recording and playing has heretofore been lost with the use of conventional amplifiers, but can be reproduced either by a recording cutting head or a speaker by employing the present invention in connection with the driving amplifier.

Typical uses of the present invention in audio systems will be found in connection with musical instrument amplifiers, hifi amplifiers, PA (public address) system amplifiers, studio monitor amplifiers, and the like.

The basic purpose of the present invention is to correct power output of the load, as for example acoustic output of a load speaker 40, so that it accurately represents the program information delivered to the input of the amplifier, as for example the program information represented by $E_{in}$ delivered to the input differential amplifier 14, regardless of discrepancies that might be introduced by load reactance or by inertia or other mechanical factors. Applicant has determined that essentially all load power output responses have corresponding load current components, regardless of whether that component be load-driving current provided by the amplifier, or a load current component generated by the load itself, as for example by a collapsing inductance field, back, e.m.f. generated by speaker overshoot, or other.

Accordingly, a signal corresponding to the instantaneous load current is continuously sensed to provide the input signal for the active feedback circuit 12 by means of a very small sensing or sampling resistor 42 disposed in the conductor 38 in series with the load 40. It is desirable that this sensing resistor 42 be small enough so that it does not dissipate any appreciable amount of the amplifier power output, and a 0.1 ohm resistor has been found to satisfactorily meet this requirement while at the same time providing ample signal to operate the active feedback circuit 12. Thus, if for example the load 40 is a 4 ohm speaker, then the sensing resistor 42 will dissipate only approximately 1/40th of the power. Then, if it is assumed that the amplifier is supplying 100 watts into the 4 ohm load, then the presence of the sensing resistor 42 will only cause a loss of about 2½ watts out of the 100 watts supplied by the amplifier, and this amount of power loss is inconsequential in view of the great power savings accomplished by the present invention. If, on the other hand, the load 40 is an 8 ohm speaker, which is conventional in hifi equipment, then only about 1/80th of the power will be dissipated in the sensing resistor 42, so that if the power supplied by the amplifier were 100 watts, then there would be a loss of only about 1¼ watts of power in the sensing resistor 42.

The voltage signal developed across sensing resistor 42 that is representative of current through the load 40 is fed to a differential operational amplifier 44 which forms part of the active feedback circuit 12. Differential operational amplifier 44 has non-inverting input 46, inverting input 48, and output 50. The high or amplifier side 52 of sensing resistor 42 is connected to the non-inverting input 46 of differential operational amplifier 44 through an input resistor 54; and the low or load side 56 of sensing resistor 42 is connected to the inverting input 48 of differential operational amplifier 44 through another input resistor 58.

Although the differential operational amplifier input resistors 54 and 58 could be directly connected to the respective high and low sides 52 and 56 of sensing resistor 42, in practice it is preferred to make these connections through respective trimmer potentiometers 60 and 62. This enables the common mode voltage applied to the differential operational amplifier 44 by the power amplifier 10 to be reduced sufficiently to avoid any possible damage to the differential operational amplifier 44. Otherwise, the differential operational amplifier 44 might be damaged by a large voltage swing, on the order of about 40 volts, associated with a large amplifier power output on the order of about 200 watts.

A feedback resistor 64 is connected between the output 50 and inverting input 48 of differential operational amplifier 44; and a balancing resistor 66 is connected between the non-inverting input 46 of differential operational amplifier 44 and ground.

The state of balance of the differential operational amplifier 44, as determined by the relative values of non-inverting and inverting input resistors 54 and 58, respectively, and by the relative values of the resistor portions of trimmers 60 and 62 in series with respective input resistors 54 and 58, assuming that feedback resistor 64 and balancing resistor 66 are equal, is an important aspect of the present invention, and will be discussed in detail hereinafter in connection with FIG. 3 which, for convenience in understanding, illustrates the differential operational amplifier 44 broken out from the rest of the active feedback circuit 12 and more conventionally laid out.

The differential operational amplifier 44 will, in response to the differential signal which it receives from across the sensing resistor 42, develop an output voltage signal which varies generally directly (although not necessarily proportionally) in response to current variations through the load 40. This output signal is fed to an operational amplifier 68 which serves as a linear amplifier to adjust the basic gain of the active feedback circuit 12, the amplifier 68 then delivering the feedback signal $E_x$ to the connection 34 associated with the inverting input 26 of input differential amplifier 14.

The amplifier 68 has its non-inverting input 70 connected to the output 50 of differential operational amplifier 44, the non-inverting input 70 having an input resistor 72 connected between it and ground. The output 74 of amplifier 68 is connected to the connection 34, and also back to the inverting input 76 through a feedback resistor 78, the inverting input 76 also being referenced to ground through a resistor 80.

The gain of amplifier 68 is determined by the ratio (resistor 78)/(resistor 80), and this gain is made adjustable by having the feedback resistor 78 variable. After the differential operational amplifier 44 has been adjusted to its desired state of balance as described in detail hereinafter, then the variable resistor 78 may be adjusted to provide a basic feedback signal level at connection 34 to the inverting input of input differential amplifier 14 which will provide the power amplifier 10 with its designed gain. Such adjustment of the variable resistor 78 will be different for different loads 40, and the gain variations up to 10:1 permitted by the circuit component values suggested for resistors 78 and 80 in FIG. 1 will permit the required adjustments for loads 40 rates at either 4 ohms or 8 ohms.

Both of the feedback circuit operational amplifiers 44 and 68 preferably have at least as good a frequency response as that of the power amplifier 10 for most effective operation of the present invention. Accordingly, both of the feed circuit operational amplifiers 44 and 68 are preferably high slew operational amplifiers. By way of example only, and not of limitation, in a prototype amplifier embodying the present invention, satisfactory response characteristics were provided by employing a 4558 dual matched pair of operational amplifiers for the amplifiers 44 and 68.

Figure 3:
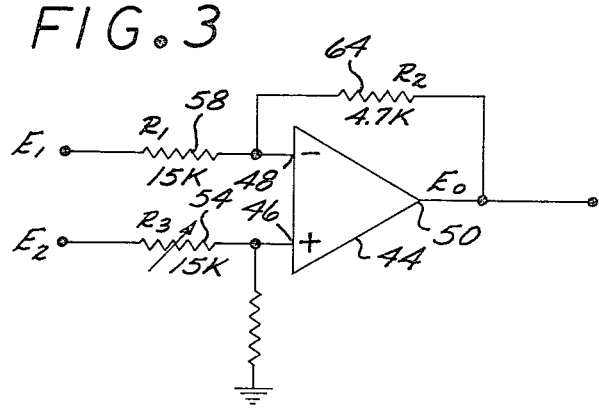
FIG. 3 is a circuit diagram showing the differential operational amplifier of the active feedback circuit of the invention broken out from the rest of the feedback circuit and more conventionally laid out.

Reference will now be made to FIG. 3 which shows the differential operational amplifier 44 and its associated circuit components broken out from the active feed circuit 12 and rearranged in a more conventional format. For convenience in the following discussion, the four resistors associated with differential operatonal amplifier 44 have been given the following additional designations:

resistor 58—$R_1$
resistor 64—$R_2$
resistor 54—$R_3$
resistor 66—$R_4$

According to standard differential operational amplifier practice, a balanced input is provided, with $R_1$ and $R_3$ being equal, and $R_2$ and $R_4$ being equal. In such a balanced condition, the output of the differential operational amplifier may be expressed by the simple formula:

$$E_o = \frac{R_2}{R_1} \cdot (E_2 - E_1)$$

where $E_o$ is the output voltage, $E_1$ is the input voltage applied to the inverting input resistor $R_1$, and $E_2$ is the input voltage applied to the non-inverting input resistor 54. The gain may be expressed from this formula as follows:

$$\frac{E_o}{(E_2 - E_1)} = \frac{R_2}{R_1}$$

which is a straight line or fixed gain. The circuit component values indicated in FIGS. 1 and 3 for the components immediately associated with the differential operational amplifier 44 will produce such a balanced condition of the differential operational amplifier 44, provided the resistor 54 is not adjusted away from the indicated value. With such indicated values, $R_1$ and $R_3$ are equal, and $R_2$ and $R_4$ are equal.

With the differential operational amplifier 44 in the active feedback circuit 12 thus in a balance condition, and assuming that the trimmers 60 and 62 are likewise balanced, since the gain of differential operational amplifier 44 is a straight line or fixed gain, its output, and hence the output feedback signal $E_x$ of the active feedback circuit 12, will be directly proportional to load current as sensed across the sensing resistor 42, regardless of the instantaneous program signal $E_{in}$. Any load current change not caused by the program, but instead caused by some load-related factor such as an increase in load impedance due to higher program signal frequency, reactance phase shift, inertial-caused spurious currents, or the like, will cause an instantaneous proportional change in the feedback signal $E_x$ produced by feedback circuit 12.

Thus, with differential operational amplifier 44 balanced, for a decrease in load current unrelated to the program, there will be a proportional decrease in the voltage input ($E_2-E_1$) to the differential operational amplifier 44, and since both of the operational amplifiers 44 and 68 are non-inverting amplifiers, there will be a corresponding proportional decrease in the output feedback signal $E_x$ from feedback circuit 12. It is important to note that this feedback signal $E_x$ actually functions as a negative feedback signal, inasmuch as the reduction in load current and corresponding reduction in feedback voltage signal $E_x$ results in a reduction of the variable potential reference point applied to the inverting input 26 of input differential amplifier 14 relative to the program signal $E_{in}$ applied to the non-inverting input 24 of amplifier 14, which increases the gain of amplifier 14 and hence that of power amplifier 10. The result is an instantaneous increase in the output voltage from power amplifier 10 independent of the program signal to compensate for the reduced current through the load.

Conversely, with the differential operational amplifier 44 thus in a balanced condition, an increase in the load current unrelated to the program signal will result in a proportional increase in the output signal $E_x$ of the active feedback circuit 12, thereby proportionally reducing the gain of input differential amplifier 14 and hence of the power amplifier 10. The resulting reduced output voltage of power amplifier 10 that is independent of the program will compensate for the increased load current.

Accordingly, in the balanced mode of differential operational amplifier 44, the active feedback circuit 12 will operate as a constant current feedback, since for any given instantaneous program signal $E_{in}$, the feedback circuit 12 will assure the same amount of current through the load despite the various load-related factors which are at that instant trying to change the load current. The active feedback circuit 12 is so responsive to every tendency of the load to change the load current independently of the program, that it appears that the entire power of the power amplifier 10 is instantaneously available to oppose such tendencies. In the case of a coil-driven speaker, predominant load-related factors which adversely affect the acoustic output with conventional amplifiers are reactance-caused phase shift, inertial lag and overshoot, and low frequency resonance speaker movements. As will be apparent from FIGS. 5-8 of the drawings and the related detailed description set forth hereinafter, the active feedback circuit 12 of the present invention so instantaneously and powerfully opposes such load-related factors that the load and its acoustic output almost exactly track with the program, and the large amplifier power bursts to accomplish the corrections are so brief that they do not materially detract from the power output of the system.

For any inductive load such as a coil-driven speaker, the impedance of the load will become greater with increases in frequency of the instantaneous program signal. Thus, as indicated by the upper curve in FIG. 4, which is the impedance curve for a typical speaker that is rated by the manufacturer as having 8 ohms at 400 Hz, the impedance rises to 16 ohms, or doubles, at approximately 2,300 Hz, and the impedance rises to 32 ohms, or four times the rated impedance, at about 10 KHz. With the conventional amplifier constant voltage feedback system, which produces substantially a constant gain over the frequency bandwidth of the amplifier into a variable load, instantaneous increases in the impedance of the load in response to instantaneous program signal frequency increases will result in proportional reductions of power to the load, as indicated by the following power formula:

$$P = E^2/Z$$

where P is power, E is voltage applied to the load, and Z is load impedance. Thus, a doubling of speaker impedance between 400 Hz and say 2,300 Hz will result in the power to the load being reduced by one-half.

On the other hand, if the feedback system provides substantially constant current despite load frequency impedance changes, as will the active feedback circuit 12 of the present invention if the differential operational amplifier 44 is adjusted or set to have a balanced input, then power to the load will increase in proportion to the load increase, as indicated by the following further power formula:

$$P = I^2 Z$$

where P is power, I is current, and Z is load impedance. Thus, doubling of the speaker impedance between 400 Hz and about 2,300 Hz for the speaker represented in FIG. 4 will cause a doubling of the power output at the higher frequency. This power/frequency distortion is a very minor factor as compared with the other speaker acoustic distortion factors which are substantially completely corrected by the active feedback circuit 12 such as losses and signal masking caused by phase shifts, power losses, signal masking and spurious signals caused by inertial drag and overshoot, and low frequency resonances. In fact, increased speaker power response at higher frequencies will enhance many types of programs.

Nevertheless, the active feedback circuit 12 of the present invention may, if desired, by adjusted or set so as to be a substantially constant power feedback system wherein the power delivered to the load 40 is substantially independent of load impedance, and hence of frequency variations in the applied program. This may be accomplished by slightly upsetting the input balance of differential operational amplifier 44 to slightly increase the gain of the non-inverting side of the differential operational amplifier 44 relative to the gain of the inverting side of the differential operational amplifier 44 (differential operational amplifier 44 comprising two out-of-phase amplifiers that cancel each other when in balance). Such upsetting of the input balance of differential operational amplifier 44 may be accomplished by slightly reducing the value of the input resistance to the non-inverting input 46 relative to the value of the input resistance to the inverting input 48. Such slight reduction in the ratio of the input resistances to the respective non-inverting and inverting inuts 46 and 48 of differential operational amplifier 44 is preferably accomplished by either reducing the value of non-inverting input resistor 54 or adjusting the trimmer potentiometer 60 to reduce the value of its resistor portion that is in series with the non-inverting input resistor 54.

This slight unbalancing of the differential inputs of operational amplifier 44 will cause the differential operational amplifier 44 to have a variable gain which varies generally inversely relative to the voltage difference sensed across the sensing resistor 42, and hence relative to the load current. This variable gain characteristic of the slightly unbalanced differential operational amplifier 44 can be seen by looking at the total differential amplifier formula which is considerably more detailed than the abbreviated formula referred to hereinabove for a balanced differential operational amplifier. Thus, while the differential amplifier gain formula reduces down to a simple fixed or straight line gain formula for a balanced differential operational amplifier as follows:

$$E_o = \frac{R_2}{R_1} \cdot (E_2 - E_1),$$

the total differential operational amplifier formula for gain is as follows:

$$E_o = \left( \frac{R_1 + R_2}{R_3 + R_4} \right) \cdot \frac{R_4}{R_1} \cdot E_2 - \frac{R_2}{R_1} \cdot E_1$$

where the voltages $E_0$, $E_1$, and $E_2$, and the resistors $R_1$, $R_2$, $R_3$ and $R_4$ are those indicated in FIG. 3. It will be seen from this formula that if the value of $R_3$ is reduced, then the gain, which is $E_0/E_2-E_1$, increases as the differential input voltage that is applied decreases, and vice versa.

The relative values of the input resistances to the respective non-inverting and inverting inputs 46 and 48 of differential operational amplifier 44 may be adjusted or set so that the gain of differential operational amplifier 44 will vary substantially inversely proportionally as the differential voltage across sensing resistor 42, and hence the load current, in which case the active feedback circuit 12 will operate as a constant power feedback, as exemplified below. Although the total gain formula set forth hereinabove for a variable differential operational amplifier does not provide an exact straight line transfer inverse proportion between load current and differential operational amplifier gain, it is close enough so that in a prototype of the present active feedback circuit 12 having the circuit component values indicated in FIGS. 1 and 3, but with the non-inverting input resistor 54 reduced from 15 K to approximately 14.8 K, the amplifier delivered constant power within one db to a load that varied from 4 ohms to 40 ohms.

As indicated hereinabove, the power formulas relating power to voltage and load, and relating power to current and load, are as follows:

$$P = E^2/Z$$

$$P = I^2 Z$$

where P is power, E is amplifier output voltage, I is load current, and Z is load impedance. From these two formulas, it will be seen that in order to maintain constant power to the load despite a change in load impedance, the amplifier voltage output E must be varied in proportion to the square root of the variation in the load, with a corresponding load current variation inversely in proportion to the square root of the variation in the load.

For example, if the load impedance were to double, in order for constant power to be maintained, the amplifier output voltage must be increased by the square root of 2, or by a factor of 1.414, while at the same time the load current will decrease by the square root of 2, or by a factor of 0.707. If the gain of differential operational amplifier 44 had been fixed, as in the balanced, constant current setting described above, then the doubled load impedance would have dropped the load current and feedback signal $E_x$ to one-half their original values, resulting in a doubled output voltage of the power amplifier which would have been required to bring the current back up to its original value. However, with the gain of differential operational amplifier 44 varying inversely proportionally as load current, or in direct proportion to the square root of load impedance, the value of the feedback signal $E_x$ will be correspondingly increased (in this example by a factor of the square root of 2), whereby the followup of the feedback servo loop including both active feedback circuit 12 and power amplifier 10 will stop at a point where the power amplifier output voltage has increased by a factor of 1.414 and load current has decreased by a factor of 0.707, which will maintain constant power.

Summarizing, if it is desired that the active feedback circuit 12 operate as a constant power feedback, then the gain of the non-inverting side of the differential operational amplifier 44 relative to the gain of the inverting side thereof is slightly increased by reducing the input resistance of the non-inverting side relative to the inverting side an amount which will cause the gain of differential operational amplifier 44 to vary substantially inversely proportionally as load current, or substantially directly proportionally as the square root of load impedance.

Corrective control over the load by the active feedback circuit 12 is excellent in the range between the aforesaid constant power and constant current settings of the differential operational amplifier 44, although the control over the load appears to maximize as the setting of the differential operational amplifier 44 approaches the constant current setting. For most types of loads, the corrective response of the active feedback circuit 12 to reactance phase shifts, and to inertial drag and overshoot and other mechanical interferences, is more important than the maintaining of constant power, and hence it is preferred in most instances to set the circuit parameters associated with differential operational amplifier 44 closer to the constant current setting than to the constant power setting. However, if the input of differential operational amplifier 44 were unbalanced in the wrong direction, i.e., if the input resistance of non-inverting input 46 were greater than that of inverting input 48, then there would be positive feedback, and the feedback loop would oscillate. Accordingly, to obtain maximum corrective control over the load, it is preferred to first arrange substantially equal input resistances for the inputs 46 and 48 of differential operational amplifier 44, and then back the resistance down a little for the non-inverting input 46 to assure against oscillation.

Figure 2:
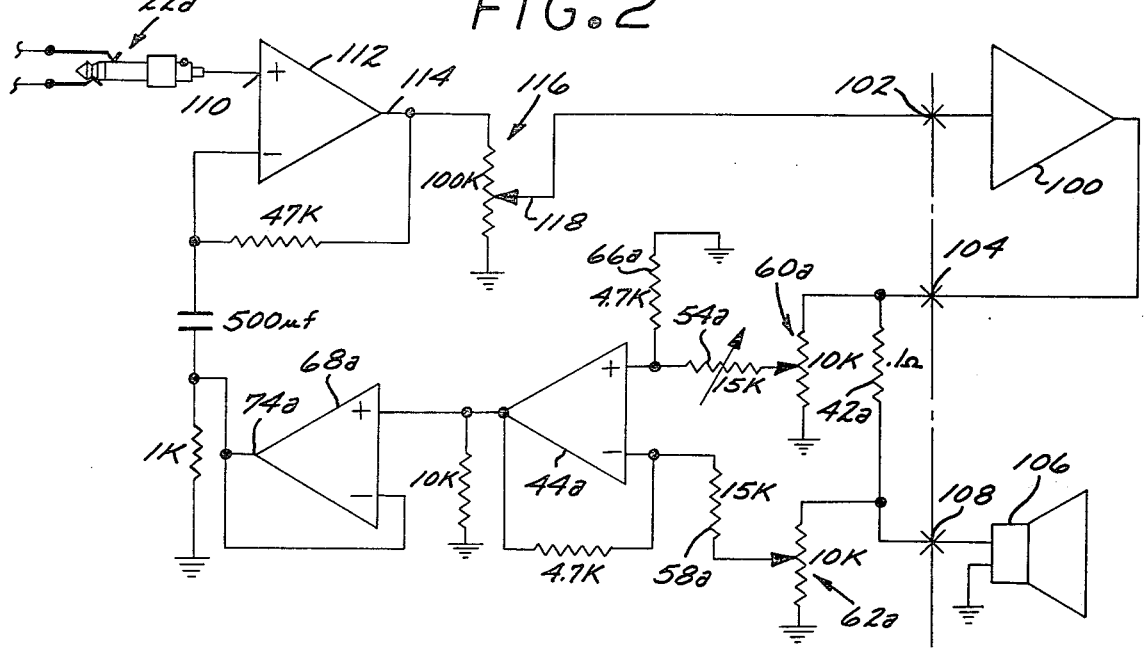
FIG. 2 is a circuit diagram illustrating another form of the invention wherein the amplifier load correction circuit is external to the power amplifier.

FIG. 2 illustrates a form of the present invention wherein the amplifier load correction circuit is external to the power amplifier, enabling the invention to conveniently be employed in connection with any existing power amplifier. Thus, in FIG. 2 a separate power amplifier 100 is shown, having an input connection 102 and an output connection 104. A separate speaker load 106 is also shown, with an input connection 108.

The program signal in FIG. 2 is fed through an input jack 22a to the non-inverting input 110 of a differential preamplifier 112. The preamplifier 112 preferably has at least as good response characteristics as the power amplifier 100 will have, and accordingly it is preferred that a high slew operational amplifier such as a 741S operational amplifier be used. The output 114 of differential preamplifier 112 is connected to the top of a voltage divider 116 which has an adjustable output 118 connected to the power amplifier input connection 102.

The active feedback circuit in FIG. 2 is generally designated 12a, and includes sensing resistor 42a, opposite sides of which are connected through respective trimmers 60a and 62a and respective input resistors 54a and 58a to differential operational amplifier 44a, the output of which is amplified by amplifier 68a to produce the feedback signal. The sensing resistor 42a is also connected at its opposite sides to the power amplifier output connection 104 and the load input connection 108, whereby sensing resistor 42a will have the load current passing therethrough so as to provide a sensed signal to differential operational amplifier 44a that corresponds to the load current. The output 74a of amplifier 68a is connected to the inverting input circuit of differential preamplifier 112 in the same manner as the output 74 of amplifier 68 is connected to the inverting input of input differential amplifier 14 in FIG. 1.

The active feedback circuit 12a of the form of the present invention illustrated in FIG. 2 has the same circuit arrangement and mode of operation as described hereinabove in detail for the active feedback circuit 12 in FIG. 1, except for the external connections 104 and 108 to which the sensing resistor 42a is connected, and also except for the lack of a variable gain arrangement for the amplifier 68a in FIG. 2. In the form of the invention shown in FIG. 2, the effective gain of the active feedback circuit is adjustable by adjustment of the voltage divider 116 which is in the overall feedback loop comprising the active feedback circuit 12a, differential preamplifier 112, and power amplifier 100.

In order to match the frequency response characteristics of the external power amplifier 100, it is preferred to employ amplifiers 44a and 68a in the active feedback circuit 12a which are high slew operational amplifiers, as for example 4558 dual operational amplifiers.

Although specific circuit component values have been set forth, and types of operational amplifiers have been suggested, in connection with FIGS. 1, 2 and 3, it is to be understood that such values and types of components have been given by way of example only, and not of limitation.

Figure 4:
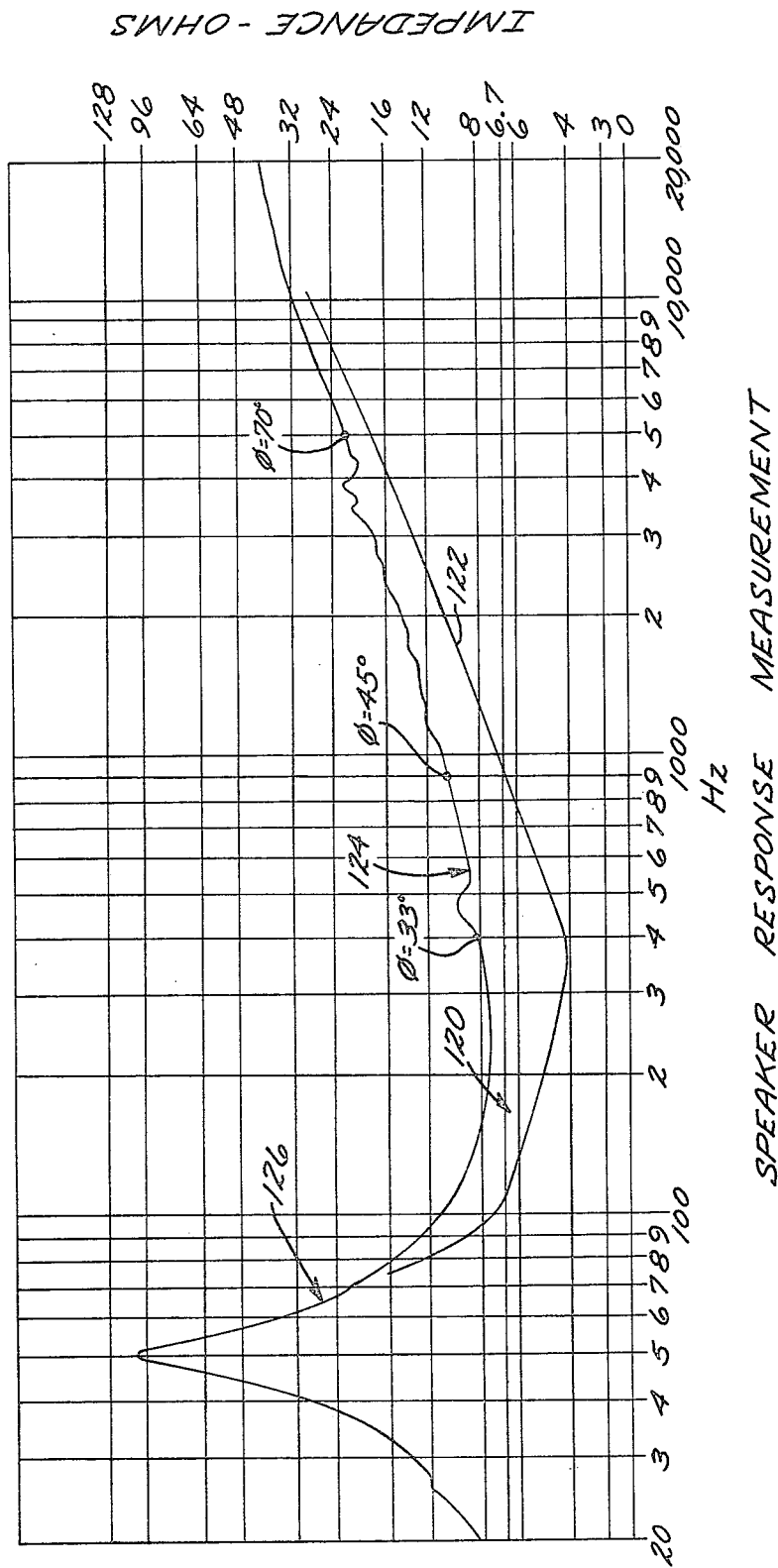
FIG. 4 shows impedance/frequency response curves for a typical speaker that is rated 8 ohms at 400 Hz.

FIG. 4 shows impedance/frequency response curves for a typical speaker that is rated 8 ohms at 400 Hz, these curves illustrating some of the serious problems inherent in conventional speakers that are corrected by the load correction system of the present invention. The straight, horizontal line 120 represents the fixed resistance of the speaker load, which in this case is approximately 6.7 ohms. The lower curve 122 represents the inductive reactance of the load, which will be seen to have a minimum near 4 ohms at about 400 Hz, and to rise steadily to approximately 27 ohms at 10 KHz. The upper curve 124 shows total speaker impedance, and represents the vector sum of speaker resistance shown in line 120 and reactance shown in line 122.

It will be noted from the total impedance curve 124 that the manufacturer's rating for the speaker of 8 ohms only holds approximately true within the very limited frequency range of from about 150 Hz to about 600 Hz, and that both below and above this limited range the impedance of the speaker load rises to considerably higher values. Thus, because of the inductive reactance of this load, its impedance doubles to 16 ohms at approximately 2,300 Hz, and quadruples to 32 ohms at about 10 KHz. Below about 150 ohms, the total impedance curve 124 sharply rises in an impedance peak designated 126 which reaches as high as about 100 ohms at 50 Hz, this large low-frequency increase in speaker impedance being caused by the open air cone resonance of the speaker.

Since power delivered to the speaker from an amplifier, and hence acoustic output of the speaker, is inversely proportional to the speaker impedance, it will be apparent from the total speaker impedance curve 124, that the higher frequencies in the amplifier program will be greatly reduced in the acoustic output relative to the lower frequencies in general, so that much of the overtone structure will be reduced or lost, and the formant structure of the program will be considerably adversely affected. At the low end of the frequency spectrum, the large impedance peak 126 represents a big hole in the acoustic output, so that much of the low frequency information in the program is lost. While multiple-speaker systems with crossover networks are widely used to improve the impedance/frequency response over that of a single speaker, such systems nevertheless introduce further problems, including phasing problems and generally sharp impedance rises proximate the crossover points. Various speaker cabinet designs are also employed in an endeavor to improve speaker response, but these, too, introduce further problems, such as speaker cabinet resonances and damping of the speaker.

Another serious problem with speakers that are driven by amplifiers without the load correction system of the present invention that is indicated in FIG. 4, but more graphically illustrated in FIGS. 5-8 and 9, is the large phase lag which the inductive reactance of the speaker causes in the speaker load current relative to the program applied to the amplifier, and also the variation of this phase lag according to program signal frequency. As indicated in FIG. 4, the phase lag angle $\phi$ of the load current caused by the total reactance shown in curve 124 is approximately 33° at 400 Hz, approximately 45° at 900 Hz, and approximately 70° at 5 KHz. Such phase lag angles of the load current relative to the program signal cause serious losses and also distortions and masking in the acoustic output of the speaker.

Thus, there is a considerable overall power loss due to this load current phase lag, as can be seen from the following power formula which represents the true power being transferred to the load for any phase angle:

i $P = E^2 \cos\phi / Z$ where P is power, E is amplifier output voltage applied to the load, $\phi$ is the phase lag angle, and Z is load impedance. The Cos of 33° is 0.839, of 45° is 0.707, and of 70° is 0.342, and since power is proportional to the Cos of the phase angle in the above formula, it will be seen that the phase angle causes a major reduction in power output, and that this reduction is quite different for different phase angles, with the greatest power losses at larger phase angles. The higher frequency power losses attributable to the increased impedance and to phase lag are cumulative, and the extent of program distortion from high frequency power losses can be illustrated by applying the above power formula to the specific phase angles of 33°, 45° and 70°, with their corresponding impedances, indicated in FIG. 4. Thus, if a constant amplifier output voltage of 10 volts is assumed, then the power being transferred to the load for these three phase angles is as follows:

$\phi = 33° - 10.5$ watts $\phi = 45° - 7.07$ watts $\phi = 70° - 2.01$ watts

Figure 5:
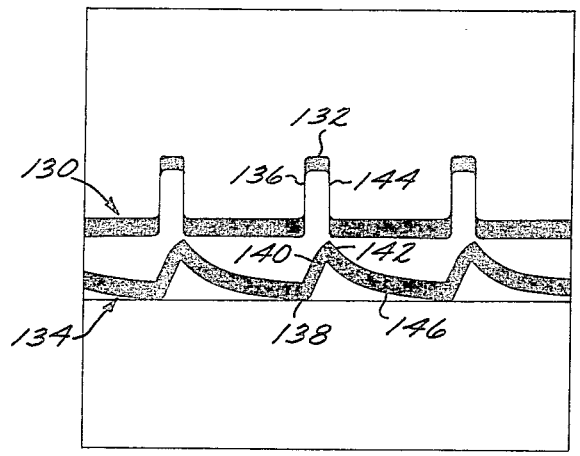
FIG. 5 shows oscilloscope images of amplifier output voltage and load current for a load that is a choke, provided by a conventional constant voltage amplifier uncorrected by the present invention.
Figure 6:
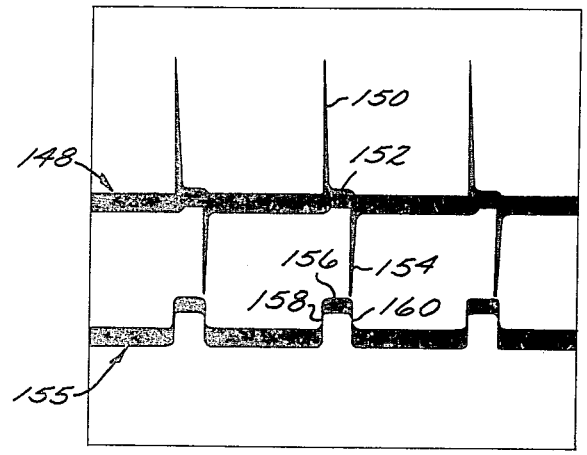
FIG. 6 is a view similar to FIG. 5, but with the amplifier corrected by the load correction system of the present invention.

FIG. 5 is a substantial reproduction of simultaneous oscilloscope images of amplifier output voltage and load current, where the load consists of a one millihenry choke, and the amplifier is a conventional constant voltage (i.e., voltage feedback) amplifier uncorrected by the load correction system of the present invention. FIG. 6 is, like FIG. 5, also a substantial reproduction of simultaneous oscilloscope images of amplifier output voltage and load current, with the same one millihenry choke load and the same amplifier, but with the active feedback circuit of the present invention as illustrated in FIG. 1 operatively associated with the amplifier and the load.

Referring to FIG. 5, the upper oscilloscope image 130 represents a regularly spaced series of one millisecond square wave voltage pulses 132. The voltage pulses 132 represent the amplifier output voltage, and correspond to the program applied to the amplifier input. The lower oscilloscope image 134 shows the resulting current through the one millihenry choke load. A choke was employed in the test illustrated in FIG. 5 because it provides an excellent graphic "worst case" illustration of the phase lag and consequent loss of power to the load and dissipation of power in the amplifier for an inductive load. It also illustrates the very poor transient or high frequency response of an inductive load.

At the sharply rising voltage wave front 136, the load current commences to slowly rise from its lowermost point 138, and the current continues to rise in almost a straight line function in the rising portion 140 of the current curve until the voltage pulse 132 ends, which stops the current rise at current peak 142 that corresponds in time to the sharp trailing edge 144 of the voltage pulse. Then the current continues to flow in the forward direction through the load in descending part 146 of the current curve, this current flowing during substantially the entire zero voltage interval between the successive voltage pulses 132.

The gradually rising portion 140 of the current curve is the only part that is concurrent with the voltage pulse 132 and hence is the only time power is being supplied to the load; however, since power equals voltage times current, and the current is only slowly rising during this time, it will be seen that only a small fraction of the available power is being supplied to the load. On the other hand, after the voltage pulse 132 has stopped, current is still being produced in the descending portion 146 of the current curve, by e.m.f. generated by the collapsing inductance field, and this current represents power that is dissipated and hence lost in the amplifier output circuit and in the resistance of the load. It will be seen from the large amount of current and the extended interval of time that it is flowing in the descending part 146 of the current curve that where highly inductive loads are employed for driving machinery, large amounts of power are not only wasted but must be coped with in the amplifier output circuit.

The very poor transient or high frequency response, which for all practical purposes is non-existent, is illustrated by the complete failure of the ascending part 140 of the current curve to track with the sharply rising voltage wave front 136, and the similar complete failure of the descending part 146 of the current curve to track with the trailing edge 144 of the voltage pulse.

FIG. 6 provides a striking illustration of how tightly the amplifier with the active feedback circuit of the present invention controls the load and forces the load current, and hence power, to comply with the program signal, in both its wave shape or form, and its phase. The voltage program that was applied to the input of the corrected amplifier in the test illustrated in FIG. 6 was the same program as was applied to the input of the uncorrected amplifier in the test illustrated in FIG. 5, namely, a series of regularly spaced one millisecond voltage pulses. However, it will be noted that the corrected amplifier output voltage wave form 148 shown in FIG. 6 is quite different than the uncorrected amplifier output voltage wave form 130 shown in FIG. 5, the corrected voltage wave form 148 having a very large positive voltage spike 150 of very short time duration corresponding to the leading edge of the voltage pulse 152, and a very large negative voltage spike 154 corresponding to the trailing edge of the voltage pulse 152.

The wave form 155 of the current through the one millihenry choke as illustrated in FIG. 6, which results from the amplifier output voltage that has been modified with the correction information supplied by the active feedback circuit of the present invention, is substantially identical to the amplifier input program wave form. Thus, the current wave form 155 consists of a series of regularly spaced, uniform, substantially flat pulses 156 having sharply rising leading edges 158 and sharply falling trailing edges 160. The current pulses 156 are seen to be accurately synchronized or completely in phase with their respective voltage pulses 152.

It appears from FIG. 6 that the active feedback circuit of the present invention has completely overcome the reactance of the choke, the large leading edge voltage spike 150 instantaneously driving the load current up to the value fixed by the resistance of the choke, where the current remains during the voltage pulse 152, and the large negative voltage spike at the trailing edge of the voltage pulse 152 instantaneously driving the load current back down to zero. Accordingly, power appears to be supplied substantially only to the DC resistance of the choke, with no material power losses being caused by the inductance of the load, and in particular no apparent power dissipation in the amplifier output circuit as a result of the inductive load.

Referring briefly back to FIG. 1, as the choke reactance is trying to hold back the flow of current at the leading edge of the amplifier output voltage (as with the slowly rising portion 140 of the current curve 134 in FIG. 5), the active feedback circuit 12 will sense the instantaneously very low current in sensing resistor 42 and produce a correspondingly low feedback voltage signal $E_x$ which, when compared to the high instantaneous $E_{in}$ of the program voltage pulse at input differential amplifier 14 will greatly increase the gain of input differential amplifier 14 to produce the instantaneous positive voltage shot or spike 150 of FIG. 6 at the output of power amplifier 10. The voltage spike 150 instantaneously raises the load current, and this is sensed by the active feedback circuit 12 which then instantaneously raises the feedback signal $E_x$ back to a normal level relative to the input voltage pulse to terminate the positive voltage spike 150 and provide flat output voltage pulse 152 from amplifier 10. Then, at the trailing edge of the pulse 152 when the slowly collapsing field of the choke keeps producing positive current (as in the descending part 146 of current curve 134 in FIG. 5) the resulting instantaneous feedback signal $E_x$ generated by the active feedback circuit 12 is greater than the instantaneous zero program input signal, reversing the differential polarity applied to differential input amplifier 14 and resulting in the large negative voltage shot or spike 154 shown in FIG. 6 which the power amplifier 10 instantaneously applies to the choke, which instantaneously collapses the choke field and drives the load current to zero, and this is then instantaneously sensed and translated by the active feedback circuit 12 into a zero feedback signal $E_x$ which correctly relates to the instantaneous program signal $E_{in}$.

Figure 7:
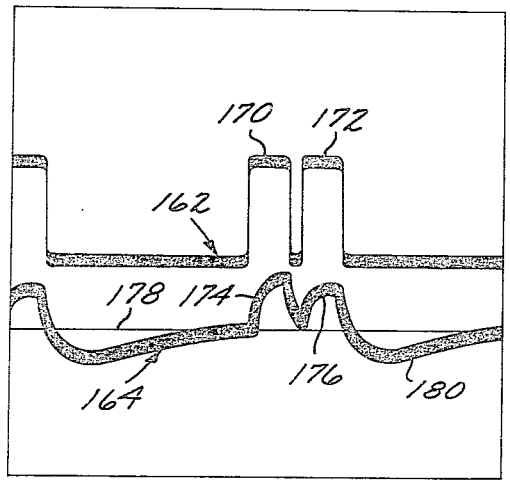
FIG. 7 is a view similar to FIG. 5, but with the load a conventional speaker.
Figure 8:
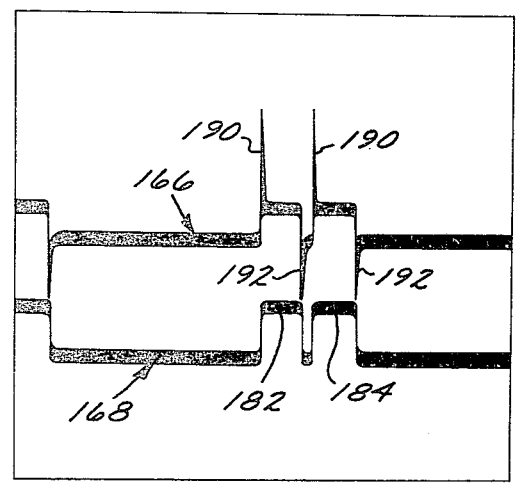
FIG. 8 is a view similar to FIG. 6, but with the load a conventional speaker; corrected by the present invention.

FIGS. 7 and 8 are similar to respective FIGS. 5 and 6, except that the program signal is in the form of repeated pairs of closely spaced square wave voltage pulses, and the load is a speaker which not only has inductive reactance like the choke load had, but also has inertial characteristics. FIG. 7 shows amplifier voltage output and load current wave forms 162 and 164, respectively, without the load correction of the present invention; while FIG. 8 shows amplifier voltage output and load current wave forms 166 and 168, respectively, with the load correction of the present invention. The individual amplifier input program pulses are, like those for FIGS. 5 and 6, of one millisecond duration, and as with FIGS. 5 and 6, the wave forms shown in FIGS. 7 and 8 show oscilloscope images of amplifier tests made respectively without and with the load correction feedback circuit of the present invention.

Referring at first to the wave forms shown in FIG. 7 for the uncorrected amplifier system, the amplifier output voltage pulses 170 and 172 correspond to respective amplifier input program pulses, and they produce respective current pulses 174 and 176 in the speaker load which are both considerably out of phase from the respective voltage pulses 170 and 172, and highly distorted relative to the respective voltage pulses 170 and 172; and the second current pulse 176 is also of lower amplitude and different configuration than the first current pulse 174. As was the case for the uncorrected choke load of FIG. 5, the uncorrected speaker load current curve 164 of FIG. 7 indicates a considerable power loss from the load and also a considerable amount of power being dissipated in the amplifier output because of the phase lag. Further, the slopes of the rising and falling portions of the current pulses 174 and 176, as compared to the sharp, vertical leading and trailing edges of the respective voltage pulses 170 and 172, indicate a poor transient or high frequency response of the speaker.

The curvature of the rising portions of both current pulses appear to show the current-retarding effects of both the expanding field of the coil and inertial drag, while the curvatures of the descending portions of both of the current pulses appear to show effects from both the collapsing coil field and reverse e.m.f. from inertial overshoot of the speaker. The overshoot effect can best be seen in the reduced amplitude of the second current pulse 176 relative to the first current pulse 174, inertial overshoot from the first driving voltage pulse 170 causing a reverse e.m.f. that reduces the effect of the second voltage pulse 172, which lowers the load current in the second current pulse 176. Then, the swing of the current curve 164 below the zero reference line 178 in the region 180 of the current curve following the second current pulse 176 represents back e.m.f. from inertial overshoot after the substantial collapse of the coil field.

It will be apparent from FIG. 8 that the amplifier load correction system of the present invention has substantially completely overridden both the inductive reactance of the speaker coil and the inertia of the coil. The two current pulses 182 and 184 are substantially identical in both wave shape and phase to the respective program signal pulses. The amplifier output voltage pulses 186 and 188 each have a large, sharp, positive leading edge spike which overcomes the current retarding effects of both the expanding coil field and inertial drag; and a large, sharp, negative trailing edge spike 192 which overcomes the combined current-producing effects of both the collapsing coil field and inertial overshoot.

The amplifier employed in the tests illustrated in FIGS. 5-8, when in its conventional mode of operation for FIG. 7, had a "damping factor" as that term is currently construed in the art, of approximately 100, which is a high damping factor. Nevertheless, as indicated in FIG. 7, the effects of speaker inertial overshoot seriously interfere with the load current, and hence the corresponding power delivered to the load. On the other hand, the substantially complete elimination of all speaker inertial effects, including inertial overshoot, indicated in FIG. 8 for the amplifier mode of operation embodying the present invention, with instantaneous high amplitude bursts of power as may be required to oppose inertial movements, indicates that the present invention is applying power braking to oppose and instantaneously stop inertial movements of the speaker, which is far more positive and effective than simply endeavoring to damp speaker movements as in conventional practice.

In a similar manner, the amplifier load correction system of the present invention will apply power opposition or braking to block various other spurious speaker movements, as for example the low frequency cone resonance movements which otherwise would produce the very serious low frequency impedance peak 126 illustrated in FIG. 4.

The active feedback circuit of the invention that was employed in the tests which produced the surprisingly responsive results shown in FIGS. 6 and 8 was set in its constant power mode, and as indicated hereinabove in connection with FIGS. 1 and 3, the active feedback would have been even more responsive if it had set or adjusted closer to its constant current mode.

Figure 9:
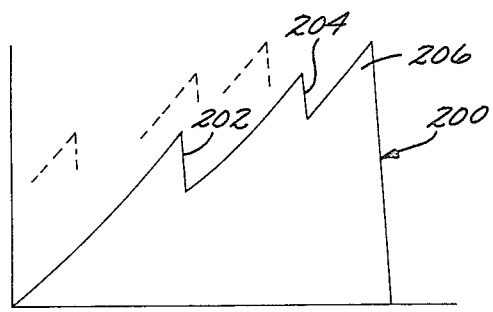
FIG. 9 is a diagrammatic representation of a wave form illustrating phase separation of high frequency components from the fundamental or basic program.

FIG. 9 diagramatically illustrates how increased phase leg at higher frequencies resulting from inductive reactance of a speaker load uncorrected by the present invention can cause overtone and transient portions of a program to be lost or seriously distorted. A fundamental frequency pulse is generally designated 200, and represents the program basis. As indicated in connection with FIG. 4, if this fundamental pulse 200 has a frequency on the order of about 400 $H_z$, then it will have a phase lag from the applied program of about 33°. Also constituting an integral part of the program are various high frequency harmonics, which are represented in FIG. 9 by the three sharp peaks 202, 204 and 206 along the top of the fundamental pulse 200. If these peaks represent frequencies on the order of about 5 $KH_z$, then they will have a phase lag of about 70° from the applied program, which means that they lag behind the fundamental pulse 200 by about 37° as shown by the respective phantom positions of peaks 202, 204 and 206 in FIG. 9. In this manner, the program basis represented by the fundamental pulse 200 would go right by the harmonics represented by the peaks 202, 204 and 206, so that this harmonic information would either disappear from, or would distort, the program played by the speaker.

Figure 10:
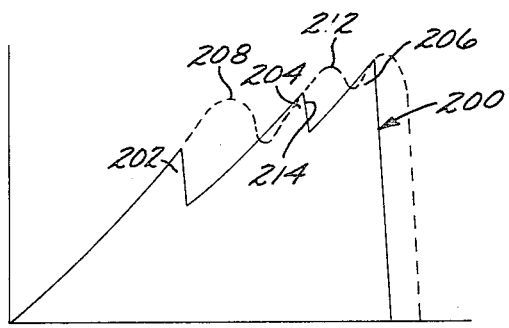
FIG. 10 is a diagrammatic view similar to FIG. 9, but illustrating inertial overshoot.

FIG. 10 illustrates how detail program information may be masked and otherwise distorted by inertial overshoot of the speaker. For convenience the same fundamental or basic program pulse 200 is shown in FIG. 10 as in FIG. 9, having the sharp peaks 202, 204 and 206. The phantom line shows the deviation from the applied program caused by inertial overshoot. The first hump 208 in the distorted phantom-line movement of the speaker indicates that the speaker has gone right by the sharp trailing edge 210 of the first peak 202, the phantom hump 208 representing the peak 202 being displaced in phase, increased in amplitude, and badly deteriorated in its harmonic content. Similarly, the second phantom line hump 212 indicates that inertial overshoot of the speaker has caused the speaker to go past the sharp trailing edge 214 of the second peak 204, thereby masking harmonic information in the peak and shifting the effective phase of the peak relative to the basic pulse 200. Finally, speaker inertial overshoot beyond the third peak 206 will not only distort that peak but will result in a phase shift of the trailing edge of the fundamental pulse 200.

Figure 11:
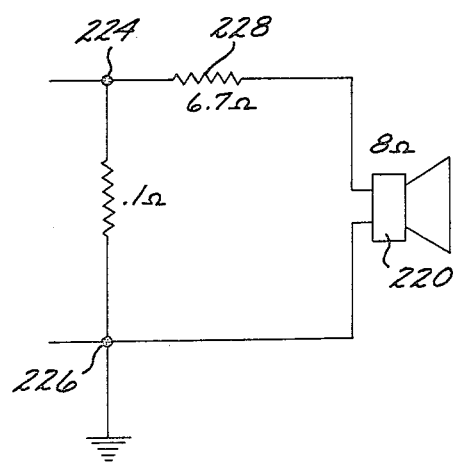
FIG. 11 is a diagrammatic illustration of an amplifier output-speaker circuit loop showing the circuit components that are involved in the actual damping factor of an amplifier-speaker combination.

FIG. 11 diagramatically illustrates one of the reasons why speaker inertial overshoot has remained a serious problem in the art despite claims in the industry of damping factors on the order of 800 or more. The term "damping factor" as is commonly used in the art designates the ratio of rated speaker impedance over amplifier output impedance. Thus, as the term "damping factor" is commonly used in the art, if the speaker is rated at 8 ohms and the amplifier output impedance is 0.1 ohms, then the rated damping factor would be 80.

FIG. 11 diagramatically illustrates the real damping factor situation for and 8 ohm speaker 220 driven by an amplifier having an output impedance 222 of 0.1 ohms between the amplifier output terminals 224 and 226. In rating the "damping factor" of this combination the art completely ignores the speaker resistance 228 which is shown in the speaker portion of the circuit in FIG. 11, and which is indicated to have a resistance of 6.7 ohms like the speaker represented in FIG. 4. However, insofar as actual damping is concerned, the speaker 220 is, in effect, looking into its own resistance in series with the amplifier output impedance in the damping circuit loop. Because of this, the real damping factor is approximately 8 ohms divided by 6.8 ohms, or only about 1.2 instead of 80. This is not enough to effectively damp speaker overshoot.

While the invention has been described with reference to the above disclosure relating to the preferred embodiments, it is understood that numerous modifications or alternations may be made by those skilled in the art without departing from the scope and spirit of the invention as set forth in the claims.

I claim:

1. A load correction system for program amplifier means having a program input and having a program output connected to a reactive load, which comprises:

differential amplifier means in said program amplifier means having a program voltage signal input connected to a source of a program voltage signal that is variable as to wave form and a feedback voltage signal input, sensing means associated with said load and having a pair of outputs for providing a differential voltage signal that varies substantially in accordance with variations in load current, a differential operational amplifier having non-inverting and inverting inputs and an output, electrical connections between said outputs of said sensing means and the respective said differential operational amplifier inputs, and electrical connection means between said output of said differential operational amplifier and said feedback voltage signal input, said differential operational amplifier providing a continuously variable corrective feedback signal to said differential amplifier means for continuously instantaneously adjusting the gain of said program amplifier means in response to deviations of the wave form and phase of the feedback signal from the wave form and phase of the program signal so as to compensate for load current deviations in wave form and phase from the program.

2. A load correction system as defined in claim 1, wherein said differential amplifier means comprises an input portion of a power amplifier.

3. A load correction system as defined in claim 1, wherein said differential amplifier means comprises a preamplifier, and said program amplifier means also includes a power amplifier.

4. A load correction system as defined in claim 1, wherein said program voltage signal input is the non-inverting input of said differential amplifier means and said feedback voltage signal input is the inverting input of said differential amplifier means.

5. A load correction system as defined in claim 1, wherein said differential operational amplifier feedback signal varies generally directly in accordance with load current variations.

6. A load correction system as defined in claim 1, wherein said inputs of said differential operational amplifier each have respective input resistor means, and said differential operational amplifier is unbalanced by said non-inverting input resistor means having less resistance than said inverting input resistor means.

7. A load correction system as defined in claim 6, wherein the resistance ratio between said input resistor means is in the range of between a ratio that will produce a gain of said differential operational amplifier that is substantially inversely proportional to said differential voltage signal, and a ratio that will produce a substantially constant gain of said differential operational amplifier.

8. A load correction system as defined in claim 1, wherein said load comprises speaker means.

9. A load correction system as defined in claim 1, wherein said sensing means comprises a sensing resistor in series with the load.

10. A load correction system as defined in claim 9, wherein said inputs of said differential operational amplifier each have respective input resistor means, and said non-inverting input resistor means is connected to the side of said sensing resistor closest to said amplifier means.

11. A load correction system as defined in claim 1, which comprises gain adjustment in the feedback loop comprising said program amplifier means, said sensing means and said differential operational amplifier.

12. A load correction system as defined in claim 11, wherein said gain adjustment means is located between said output of said differential operational amplifier and said feedback voltage signal input.

13. A load correction system as defined in claim 11, wherein said gain adjustment means is located in said program amplifier means.

* * * * *